(12) United States Patent
Ohkuma

(10) Patent No.: US 9,105,997 B2
(45) Date of Patent: Aug. 11, 2015

(54) CONNECTOR

(75) Inventor: Yoshihito Ohkuma, Kanagawa (JP)

(73) Assignee: IRISO ELECTRONICS CO., LTD., Kanagawa (JP)

( * ) Notice: Subject to any disclaimer, the term of this patent is extended or adjusted under 35 U.S.C. 154(b) by 110 days.

(21) Appl. No.: 13/819,489

(22) PCT Filed: Mar. 28, 2011

(86) PCT No.: PCT/JP2011/057541
§ 371 (c)(1),
(2), (4) Date: Feb. 27, 2013

(87) PCT Pub. No.: WO2012/026153
PCT Pub. Date: Mar. 1, 2012

(65) Prior Publication Data
US 2013/0157519 A1 Jun. 20, 2013

(30) Foreign Application Priority Data

Aug. 27, 2010 (JP) .................. 2010-190423

(51) Int. Cl.
| | |
|---|---|
| *H01R 13/00* | (2006.01) |
| *H01R 13/28* | (2006.01) |
| *H01R 12/91* | (2011.01) |
| *H01R 12/73* | (2011.01) |
| *H05K 1/14* | (2006.01) |
| *H01R 12/72* | (2011.01) |
| *F21V 23/06* | (2006.01) |
| *H01R 13/627* | (2006.01) |
| *H01R 35/00* | (2006.01) |

(Continued)

(52) U.S. Cl.
CPC .............. *H01R 13/28* (2013.01); *H01R 12/732* (2013.01); *H01R 12/91* (2013.01); *H05K 1/142* (2013.01); *F21V 23/06* (2013.01); *F21Y 2101/02* (2013.01); *F21Y 2103/003* (2013.01); *H01R 12/724* (2013.01); *H01R 13/6278* (2013.01); *H01R 35/00* (2013.01); *H05K 2201/10189* (2013.01); *H05K 2201/10446* (2013.01)

(58) Field of Classification Search
CPC ............................... H01R 23/725; H01R 35/04
USPC ..................................... 439/39, 682
See application file for complete search history.

(56) References Cited

U.S. PATENT DOCUMENTS 3,795,883 A * 3/1974 Ackerman et al. ............ 439/106
4,632,475 A * 12/1986 Tomita ............... 439/1

(Continued)

FOREIGN PATENT DOCUMENTS

| EP | 1544957 A1 | 6/2005 |
|---|---|---|
| JP | 2005-158331 | 6/2005 |
| JP | 2005-183380 | 7/2005 |

*Primary Examiner* — Phuong Dinh
(74) *Attorney, Agent, or Firm* — Lowe Hauptman & Ham, LLP

(57) ABSTRACT

A connector which can absorb thermal expansion and contraction of a substrate, or positional deviation of the substrate, and which enables the male and female connectors thereof to be fitted to each other where the male and female connectors are inclined to each other. A male terminal of a male connector, and a female terminal of a female connector are slidable relative to each other when in contact with each other. The male terminal and the female terminal are rotatable relative to each other about a contact point when in contact with each other, and hence the male terminal and the female terminal can be attached and detached to and from each other at an arbitrary rotating position.

9 Claims, 14 Drawing Sheets

(51) Int. Cl.
*F21Y 101/02* (2006.01)
*F21Y 103/00* (2006.01)

(56) References Cited

U.S. PATENT DOCUMENTS

| | | | |
|---|---|---|---|
| 4,657,320 A * | 4/1987 | Bamford et al. | 439/31 |
| 5,816,839 A * | 10/1998 | Muta | 439/342 |
| 6,350,154 B1 * | 2/2002 | Fu | 439/638 |
| 7,549,892 B2 * | 6/2009 | Sawyers et al. | 439/500 |
| 8,317,535 B2 * | 11/2012 | Yasui | 439/378 |
| 8,337,237 B2 * | 12/2012 | Masuda et al. | 439/374 |
| 8,727,813 B2 * | 5/2014 | Yang et al. | 439/682 |
| 2005/0112928 A1 | 5/2005 | Funatsu | |
| 2005/0153579 A1 | 7/2005 | Listing et al. | |

* cited by examiner

CONNECTOR

TECHNICAL FIELD

The present invention relates to a connector which is attached, for example, to an end portion of an LED substrate and which is used for connecting substrates to each other.

BACKGROUND ART

Conventionally, there has been known a configuration in which, when a plurality of substrates are connected to each other so that the mounting surfaces of electronic components, and the like, are arranged to form the same plane, the substrates are connected to each other in such a manner that a male connector and a female connector are respectively attached to both ends of each of the substrates, and that the male connector of one of the substrates is fitted to the female connector of the other of the substrates (see, for example, Patent Literature 1).

CITATION LIST

Patent Literature

Patent Literature 1: Japanese Utility Model No. 3092610

SUMMARY OF INVENTION

Technical Problem

Meanwhile, when a heat-generating electric component is mounted on the substrate or when the substrate is mounted in an apparatus in which the temperature around the substrate becomes high, the substrate is thermally expanded or contracted. Further, when the substrate is attached to a mounting surface by adhesive tape or contact, a positional deviation of the substrate may be caused. However, in the state where the substrates are connected to each other by the connector, the male connector and the female connector are fitted to each other in a relatively immovable manner, and hence the thermal expansion and contraction of the substrate or the positional deviation of the substrate cannot be absorbed. This may result in deformation of the substrate or breakage of the connector due to the thermal expansion of the substrate, or may result in a connection failure due to the thermal contraction or the positional deviation of the substrate.

Further, in the conventional connector, the male connector and the female connector can be attached and detached to and from each other only in the state where the substrates are arranged in a horizontal state. Therefore, for example, in such a case where one substrate, which is fixed to a mounting surface, is connected to the other substrate, there arises a problem that, even when, if the other substrate can be fitted to the one substrate in the state of being inclined to the one substrate, the connection work is easily performed, the oblique fitting of the connectors cannot be performed, and hence the connection work of the connectors is difficult to be performed.

The present invention has been made in view of the above described problems. An object of the present invention is to provide a connector which can absorb thermal expansion and contraction of a substrate, or positional deviation of the substrate, and in which the male connector and the female connector of the connector can be fitted to each other in a state where the connectors are inclined to each other.

Solution to Problem

In order to achieve the above described object, a connector according to the present invention includes a male connector attached to an end portion of one substrate, a female connector attached to an end portion of the other substrate, a male terminal held at the connector main body of the male connector, and a female terminal held at the connector main body of the female connector, and is configured such that the substrates are connected to each other by fitting the male connector and the female connector to each other. The connector according to the present invention is featured in that the male terminal and the female terminal are configured to be slidable relative to each other in a state of being in contact with each other, and are configured to be rotatable relative to each other about a contact point in a state of being in contact with each other.

Thereby, the male terminal and the female terminal are configured to be slidable relative to each other in a state of being in contact with each other, and hence thermal expansion and contraction of the substrate, or positional deviation of the substrate can be absorbed by the sliding of the male terminal and the female terminal relative to each other. Further, the male terminal and the female terminal are configured to be rotatable relative to each other about a contact point in a state of being in contact with each other, and hence the male terminal and the female terminal can be attached and detached to and from each other at an arbitrary rotating position.

Advantageous Effects of Invention

In the present invention, since thermal expansion and contraction of the substrate, or positional deviation of the substrate can be absorbed by the sliding of the male terminal and the female terminal relative to each other, deformation of the substrate and breakage of the connector due to the thermal expansion of the substrate can be prevented, and also connection failure due to the thermal contraction or the positional deviation of the substrate can be prevented. Further, since the male terminal and the female terminal can be attached and detached to and from each other at an arbitrary rotating position, the male connector and the female connector can be fitted to each other in a state where the male connector and the female connector are inclined to each other. Thereby, for example, in such a case where one substrate, which is fixed to a mounting surface, is connected to the other substrate, the male and female connectors can be fitted to each other in a state where the other substrate is inclined to the one substrate, and hence the work of connecting the substrates to each other can be easily performed.

DESCRIPTION OF EMBODIMENTS

Figure 1:
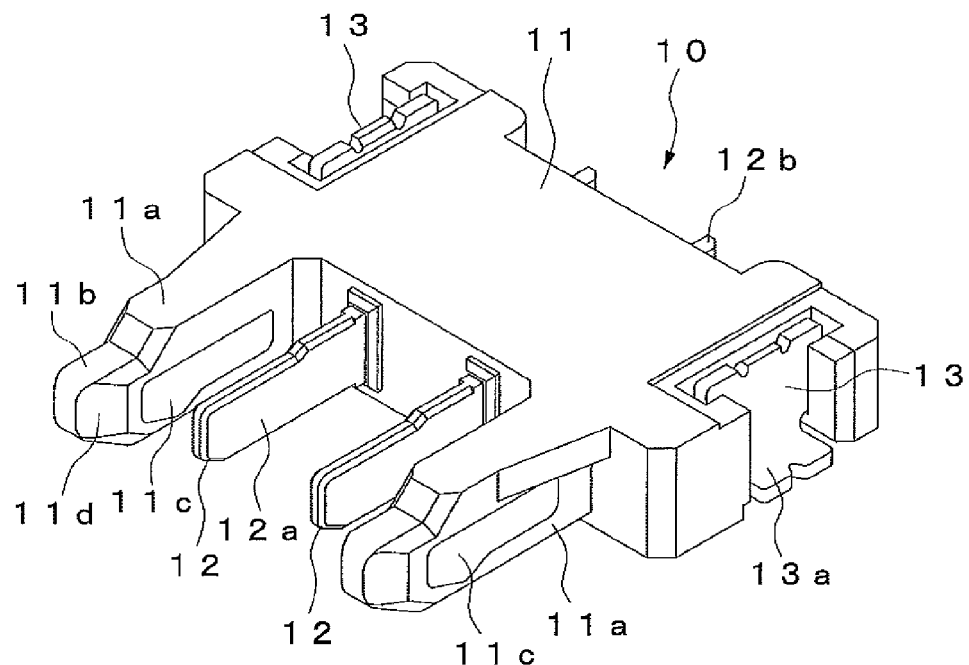
FIG. 1 is a perspective view of a male connector showing an embodiment of the present invention.
Figure 2:
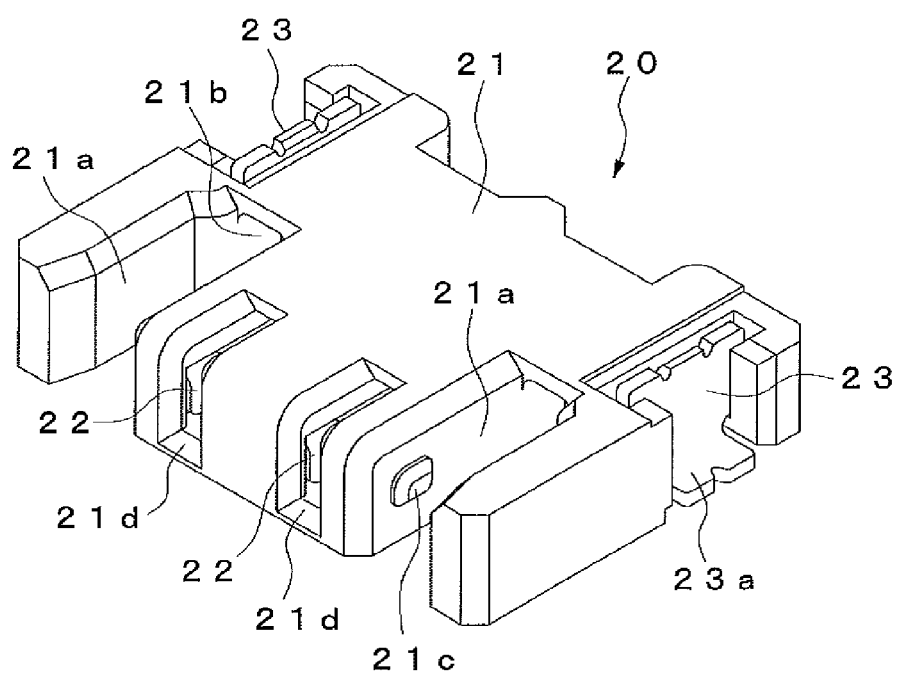
FIG. 2 is a perspective view of a female connector.
Figure 3:
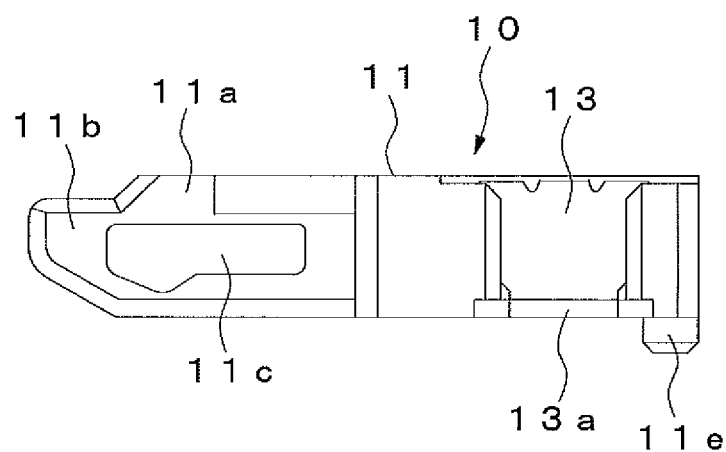
FIG. 3 is a side view of the male connector.
Figure 4:
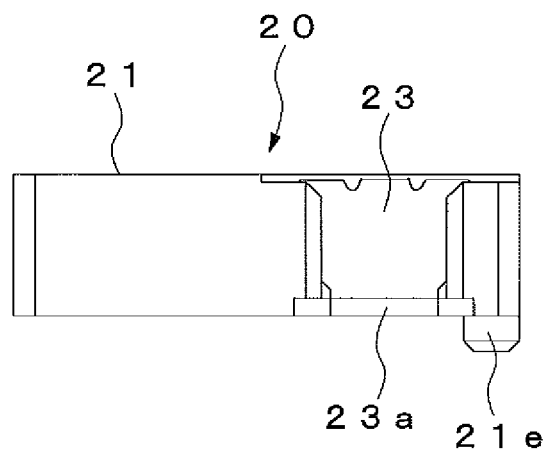
FIG. 4 is a side view of the female connector.
Figure 5:
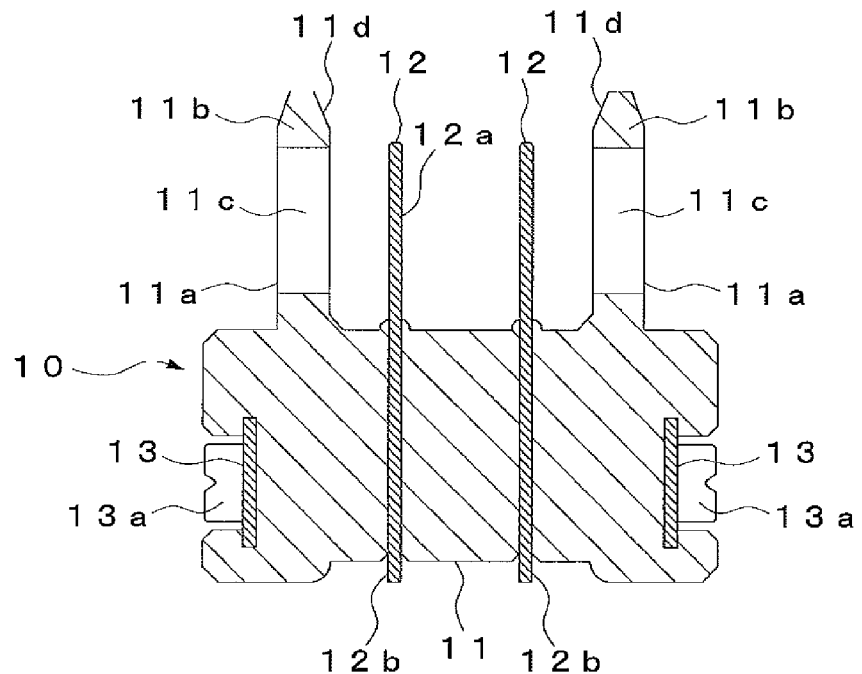
FIG. 5 is a plan sectional view of the male connector.
Figure 6:
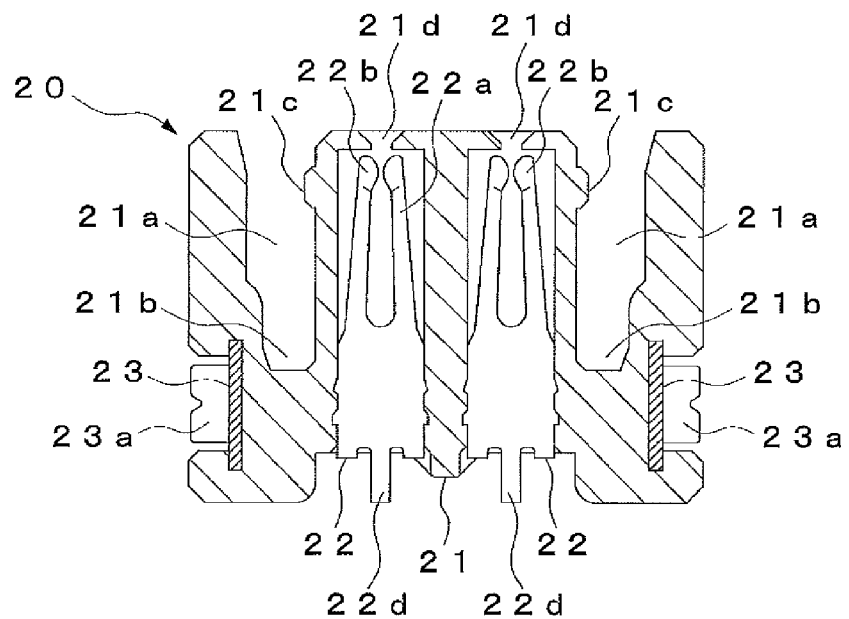
FIG. 6 is a plan sectional view of the female connector.
Figure 7:
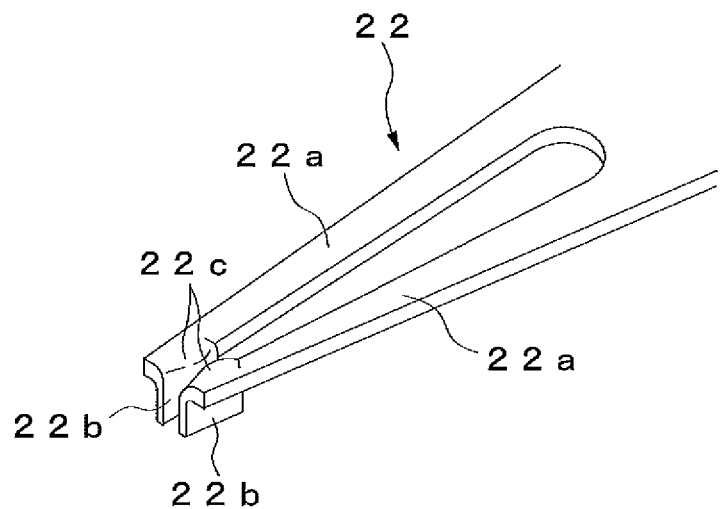
FIG. 7 is a perspective view of a major portion of a female terminal.
Figure 8:
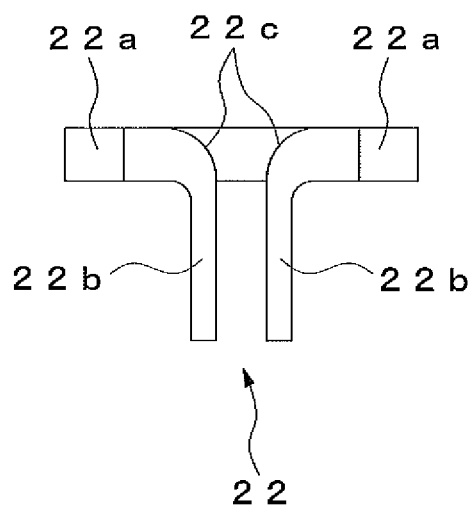
FIG. 8 is a front view of a major portion of the female terminal.
Figure 9:
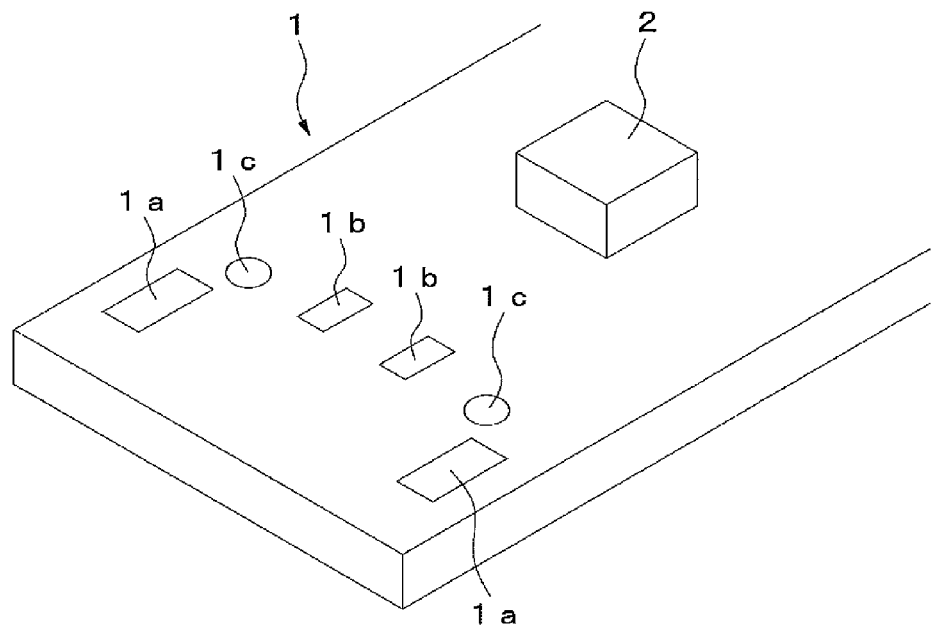
FIG. 9 is a perspective view of a major portion of a substrate.
Figure 10:
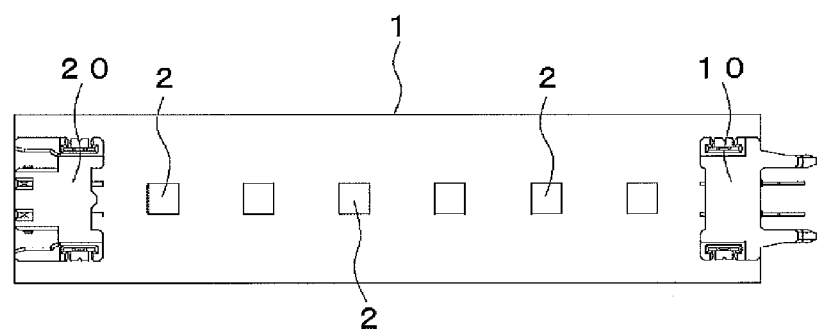
FIG. 10 is a plan view of the substrate to which the connector is attached.
Figure 11:
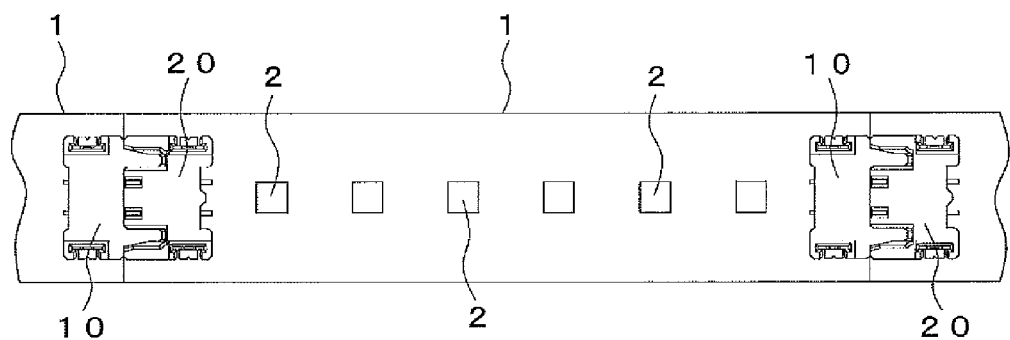
FIG. 11 is a plan view of the substrates connected to each other by the connector.
Figure 12:
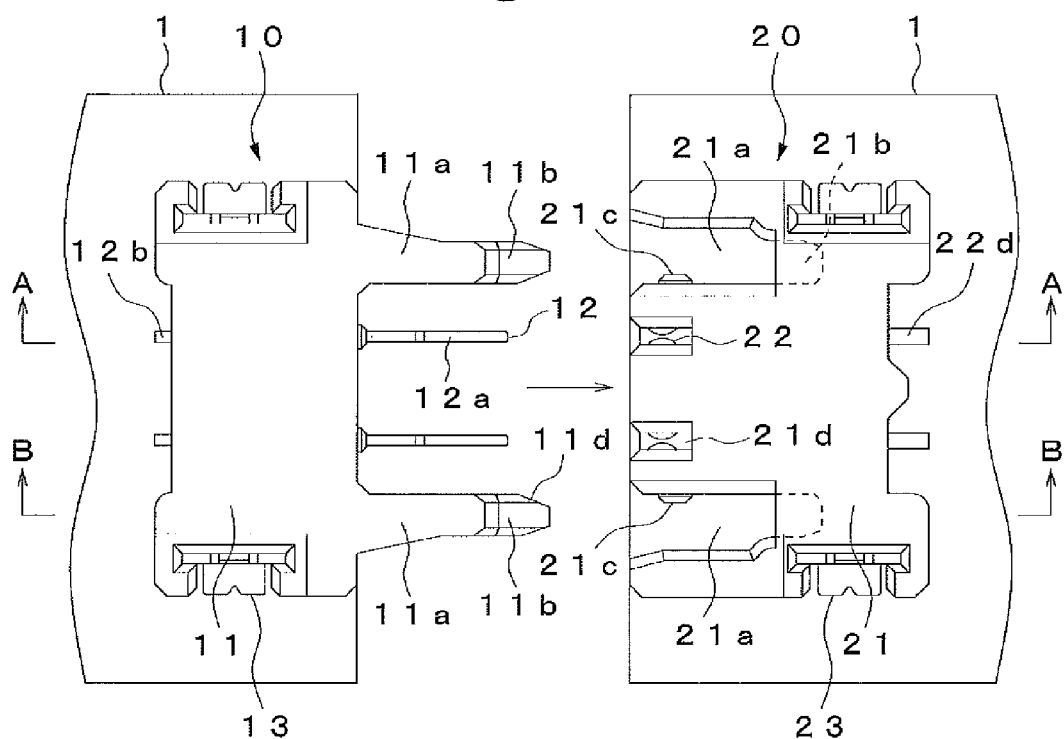
FIG. 12 is a plan view showing a fitting step of the male connector and the female connector.
Figure 13:
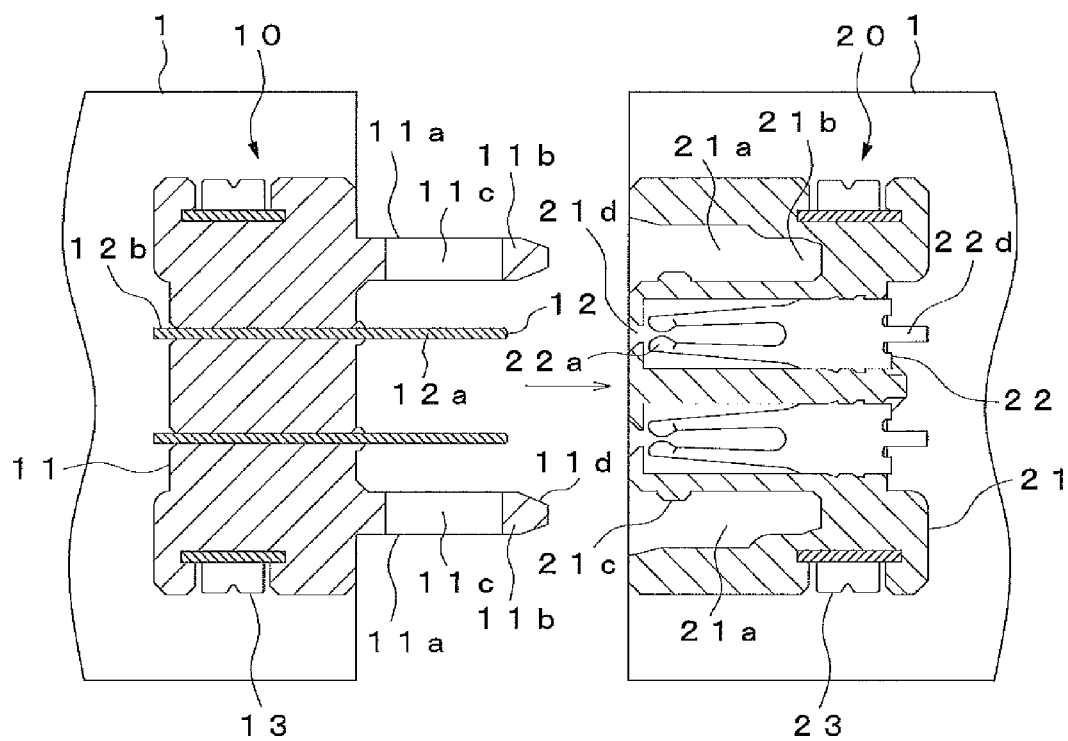
FIG. 13 is a plan sectional view showing the fitting step of the male connector and the female connector.

FIG. 1 to FIG. 29 show an embodiment according to the present invention. The connector shown in FIG. 1 to FIG. 29 is used for connecting a plurality of LED substrates 1.

The substrate 1 is formed in a plate shape extending long in the LED array direction, and a plurality of LEDs 2 are mounted on one thickness direction surface of the substrate 1 at intervals therebetween in the longitudinal direction of the substrate 1. On each of both longitudinal end portions of the substrate 1, a pair of connector fixing portions 1a each formed by a metallic surface, a pair of terminal connecting portions 1b to which terminals of the connector are connected, and a pair of holes 1c with which the connector engages are provided so that each pair of the portions and of the holes are arranged in parallel with the width direction of the substrate 1.

The connector of the present embodiment includes a male connector 10 attached to one substrate 1 of a pair of mutually adjacent substrates 1, and a female connector 20 attached to the other substrate 1 of the pair of mutually adjacent substrates 1, and is configured such that the substrates 1 are connected to each other by fitting the male connector 10 and the female connector 20 to each other.

The male connector 10 is configured by a connector main body 11 made of a synthetic resin molding, a pair of male terminals 12 held at the connector main body 11 and arranged in the width direction of the connector main body 11, and a pair of fixing members 13 attached to the connector main body 11 and arranged in the width direction of the connector main body 11.

The connector main body 11 is formed in a flat shape having a height dimension smaller than a width dimension, and the upper surface of the connector main body 11 is formed in a flat shape as a whole. The connector main body 11 has a pair of extension portions 11a each extending from each of both width-direction sides of the front end surface to the front side of the connector main body 11. The extension portions 11a are respectively provided on the width-direction inner side from both side surfaces of the connector main body 11. The proximal-end-side upper surface of each of the extension portions 11a is formed to form the same plane as the upper surface of the connector main body 11, and the upper surface of a distal end portion 11b of each of the extension portions 11a is formed to be lower than the proximal-end-side upper surface so that a level difference is formed between the upper surface of the distal end portion 11b and the proximal-end-side upper surface. Further, an engagement hole 11c which engages with the female connector 20 is provided in the side surface of each of the extension portions 11a. The engagement hole 11c is formed in a long hole extending in the longitudinal direction (front and rear direction) of the extension portion 11a and is formed so as to penetrate both the side surfaces of the extension portion 11a. Further, at the distal-end-side mutually facing surfaces of the extension portions 11a, inclined surfaces 11d, the distance between which is increased toward the distal end side, are provided, respectively. On the rear end side of the connector main body 11, a pair of protrusions 11e, which are arranged in the width direction of the connector main body 11 and which are to be inserted into the holes 1c of the substrate 1, are projectingly provided on the lower surface of the connector main body 11.

The male terminals 12 are each made of a conductive metal plate formed so that the thickness direction thereof is directed to the width direction of the male connector 10, and are arranged at a distance from each other in the width direction of the male connector 10. The front end side of each of the male terminals 12 is made to project to the front side from the front end surface of the connector main body 11, and is arranged between the extension portions 11a of the connector main body 11. The front end side of each of the male terminals 12 forms a contact portion 12a which is brought into contact with a female terminal, and the distal-end-side upper end of the contact portion 12a is formed to be lower than the proximal-end-side upper end of the contact portion 12a so that a level difference is formed between the distal-end-side upper end and the proximal-end-side upper end. A connecting portion 12b, which is to be connected to the substrate 1, is provided on the rear end side of each of the terminals 12, so as to project toward the rear side from the rear surface of the connector main body 11.

The fixing member 13 is made of a metal plate bent in an L-shape and is arranged on both width-direction sides of the connector main body 11. The fixing member 13 has, on the lower end side thereof, a joining portion 13a to be joined to the connector fixing portion 1a of the substrate 1, and is attached to the connector main body 11 by making the upper end side of the fixing member 13 press-fitted into the connector main body 11.

The female connector 20 is configured by a connector main body 21 made of a synthetic resin molding, a pair of female terminals 22 held at the connector main body 21 and arranged in the width direction of the connector main body 21, and a pair of fixing members 23 attached to the connector main body 21 and arranged in the width direction of the connector main body 21.

The connector main body 21 is formed in a flat shape having a height dimension smaller than a width dimension, and the upper surface of the connector main body 21 is formed in a flat shape as a whole. A pair of recessed portions 21a, which respectively receive the extension portions 11a of the male connector 10, are provided on both width-direction sides of the front end surface of the connector main body 21. The recessed portions 21a are respectively provided on the width-direction inner side from both side surfaces of the connector main body 21. A lock hole 21b as a rotation restricting portion, which receives the distal end portion 11b of each of the extension portions 11a, is provided on the depth side of each of the recessed portions 21a, and is formed so as to close the depth-side upper surface of the recessed portion 21a. On one side surface (the side surface on the width-direction central side of the connector main body 21) in each of the recessed portions 21a, a projecting portion 21c, which engages with the engagement hole 11c of the extension portion 11a, is provided so as to be movable and rotatable in the engagement hole 11c. In the connector main body 21, a pair of insertion ports 21d, which are arranged in the width direction of the connector main body 21 and into which the male terminals 12 are inserted, are provided so as to form a long hole-shaped opening ranging from the front surface to the upper surface of the connector main body 21. On the rear end side of the connector main body 21, a pair of protrusions 21e, which are arranged in the width direction of the connector main body 21 and which are to be inserted into the holes 1c of the substrate 1, are projectingly provided on the lower surface of the connector main body 21.

The female terminals 22 are each made of a conductive metal plate, the distal end side of which is formed in a two-forked shape, and are arranged at a distance from each other in the width direction of the connector main body 21. A pair of elastic piece portions 22a, which are arranged in the width direction of the connector main body 21 and which extend in the front and rear direction, are provided on the front end side of each of the female terminals 22. A contact portion 22b, which is brought into contact with the male terminal 12, is provided at the distal end portion of each of the elastic piece portions 22a. Each of the contact portions 22b is configured to project in the direction in which the contact portions 22b face each other, and is configured such that, when the contact portion 12a of the male terminal 12 is sandwiched between the contact portions 22b by the elasticity of each of the elastic piece portions 22a, the male terminal 12 and the contact portion 22b are brought into contact with each other so as to be rotatable relative to each other about a contact point P. Each of the contact portions 22b is formed, for example, by a drawing process, so as to extend downward from the width-direction inner end edge of each of the elastic piece portions 22a, and each of the upper-end-side mutually facing edge portions of the contact portions 22b is formed by a chamfered portion 22c having a curved surface shape. Each of the female terminals 22 is arranged in the connector main body 21, and is configured to be brought into contact with the contact portion 12a of the male terminal 12 which is inserted from the front side or the upper side of the insertion port 21d. A connecting portion 22d, which is to be connected to the substrate 1, is provided on the rear end side of each of the female terminals 22, so as to project toward the rear side from the rear surface of the connector main body 21.

The fixing member 23 is made of a metal plate bent in an L-shape and is arranged on both width-direction sides of the connector main body 21. The fixing member 23 has, on the lower end side thereof, a joining portion 23a to be joined to the connector fixing portion 1a of the substrate 1, and is attached to the connector main body 21 by making the upper end side of the fixing member 23 press-fitted into the connector main body 21.

In the connector configured as described above, when the male connector 10 is attached to one substrate 1, the male connector 10 is positioned by inserting the protrusion 11e of the connector main body 11 into each of the holes 1c of the substrate 1, and the joining portion 13a of each of the fixing members 13 is joined to the connector fixing portion 1a of the substrate 1 by soldering. Further, the connecting portion 12b of each of the male terminals 12 is connected to the terminal connecting portion 1b of the substrate 1 by soldering. Thereby, the male connector 10 is attached to the end portion of the one substrate 1. In this case, the male connector 10 is attached to the one substrate 1 so that only the extension portions 11a of the connector main body 11 and the contact portions 12a of the male terminals 12 respectively project to the outer side from the end edge of the one substrate 1.

Further, when the female connector 20 is attached to the other substrate 1, the female connector 20 is, similarly to the male connector 10, positioned by inserting the protrusion 21e of the connector main body 21 into each of the holes 1c of the substrate 1, and the joining portion 23a of each of the fixing members 23 is joined to the connector fixing portion 1a of the substrate 1 by soldering. Further, the connecting portion 22d of each of the female terminals 22 is connected to the terminal connecting portion 1b of the substrate 1 by soldering. Thereby, the female connector 20 is attached to the end portion of the other substrate 1. In this case, the female connector 20 is attached to the substrate 1 so that the front end surface of the connector main body 21 is positioned at the same position as the position of the end edge of the substrate 1.

Next, when the one substrate 1 and the other substrate 1 are connected to each other, each of the extension portions 11a of the male connector 10 and each of the recessed portions 21a of the female connector 20 are fitted to each other, and thereby the male connector 10 of the one substrate 1 and the female connector 20 of the other substrate 1 are connected to each other. Further, in the case where the connectors 10 and 20 are horizontally connected to each other as shown in FIG. 12 to FIG. 23, when each of the extension portions 11a of the male connector 10 is inserted into each of the recessed portions 21a of the female connector 20, the inclined surface 11d of each of the extension portions 11a is brought into contact with the projecting portion 21c of each of the recessed portions 21a, and each of the extension portions 11a gets over the projecting portion 21c by the inclined surface 11d while each of the extension portions 11a is elastically deformed toward the width-direction outer side of the connector main body 11. Thereby, the projecting portion 21c is engaged with the engagement hole 11c of each of the extension portions 11a. At this time, the contact portion 12a of each of the male terminals 12 is inserted into each of the insertion ports 21d of the female connector 20 from the front side of the connector main body 21, so that the contact portion 12a of the male terminal 12 and the contact portion 22b of the female terminal 22 are brought into contact with each other. In this case, the male terminal 12 and the female terminal 22 are brought into contact with each other at the contact point P between the contact portions 12a and 22b. However, when each of the extension portions 11a is further moved toward the depth side of each of the recessed portions 21a, the male terminal 12 is made to slide while being in contact with the female terminal 22 at the contact point P, and thereby the male connector 10 and the female connector 20 are fitted to each other until the projecting portion 21c is brought into contact with the longitudinal one end of the engagement hole 11c.

Figure 14:
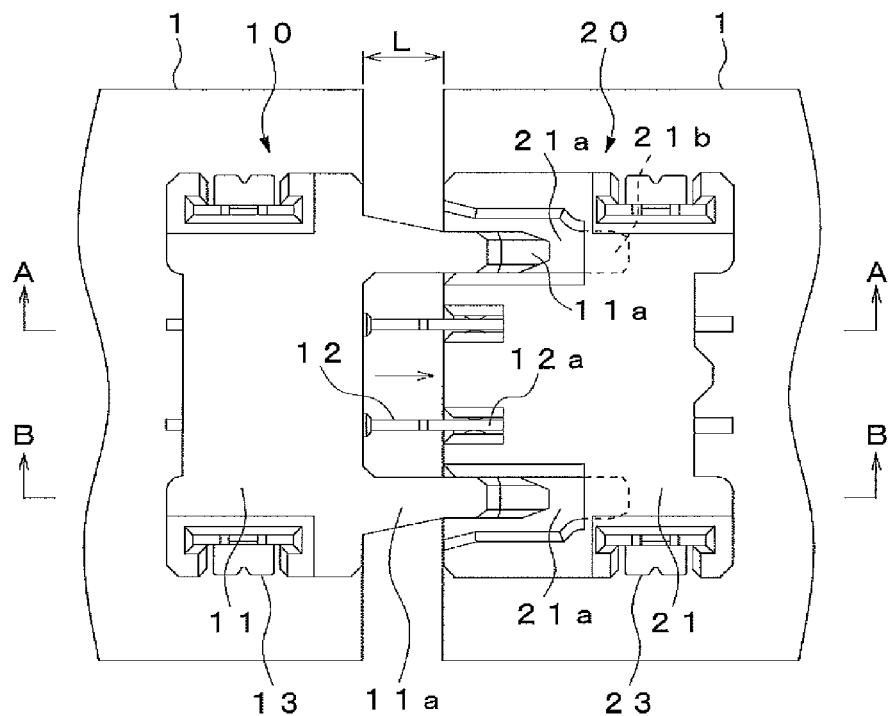
FIG. 14 is a plan view showing a fitting step of the male connector and the female connector.
Figure 15:
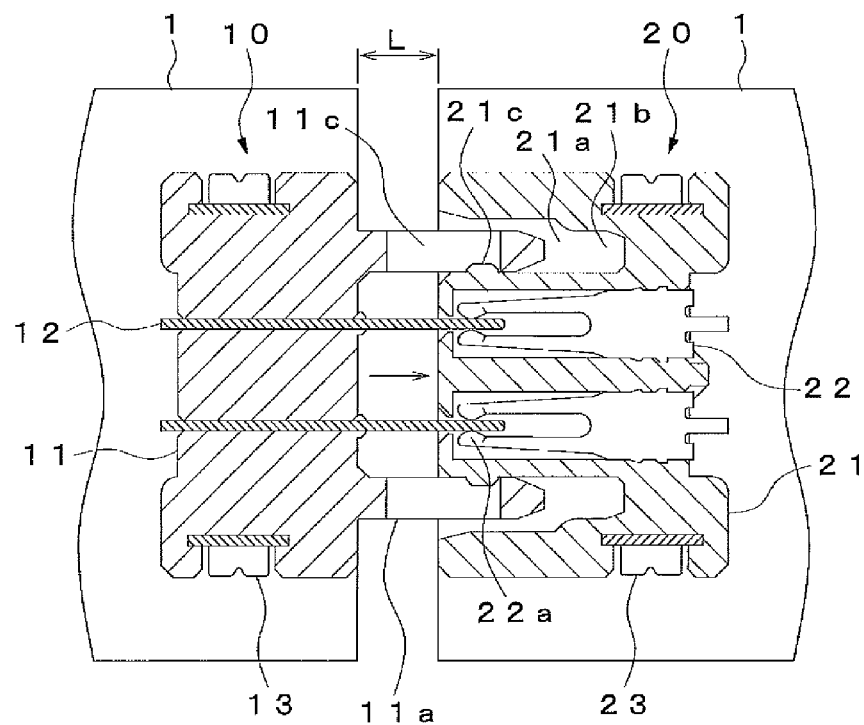
FIG. 15 is a plan sectional view showing the fitting step of the male connector and the female connector.
Figure 16:
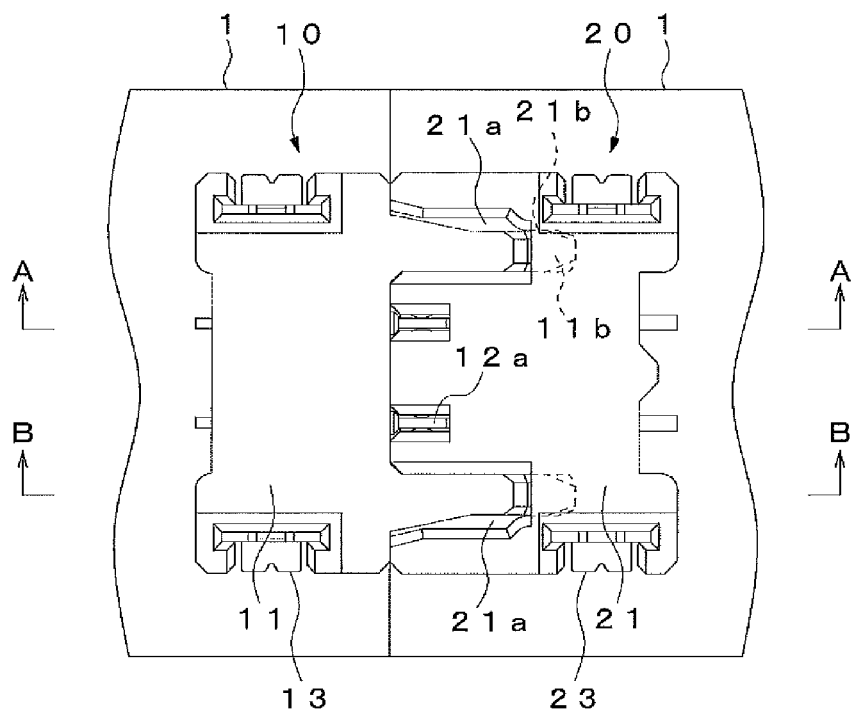
FIG. 16 is a plan view showing a fitting step of the male connector and the female connector.
Figure 17:
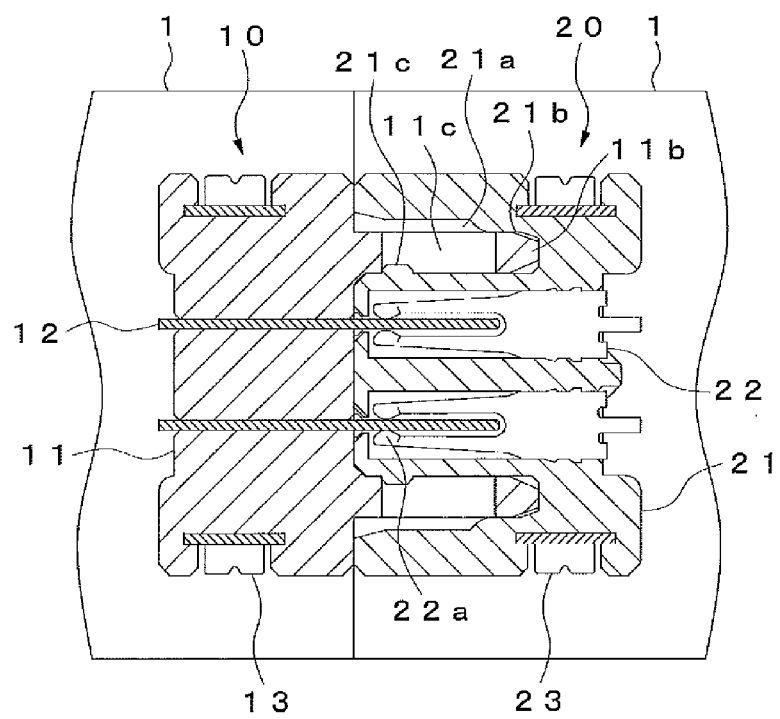
FIG. 17 is a plan sectional view showing the fitting step of the male connector and the female connector.
Figure 18:
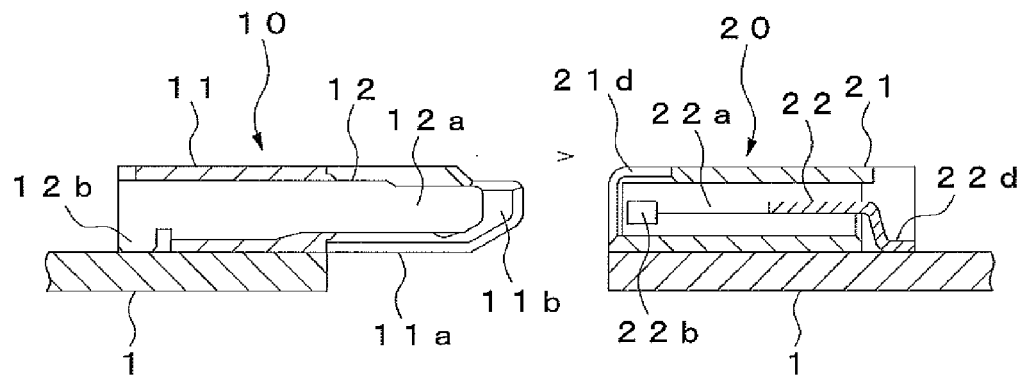
FIG. 18 is an A-A cross-sectional view showing the fitting step of the male connector and the female connector.
Figure 19:
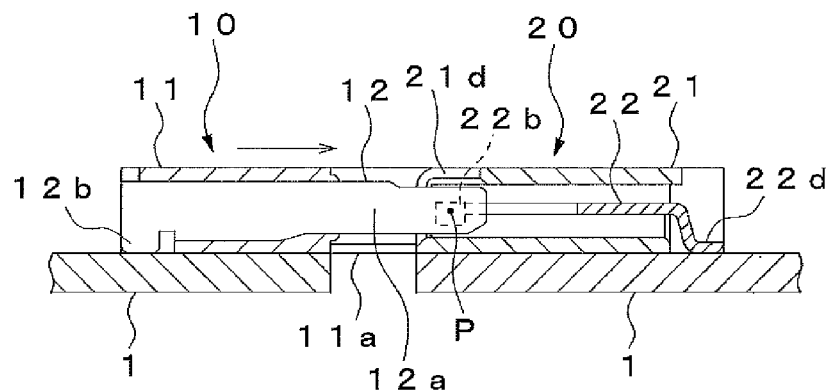
FIG. 19 is an A-A cross-sectional view showing the fitting step of the male connector and the female connector.
Figure 20:
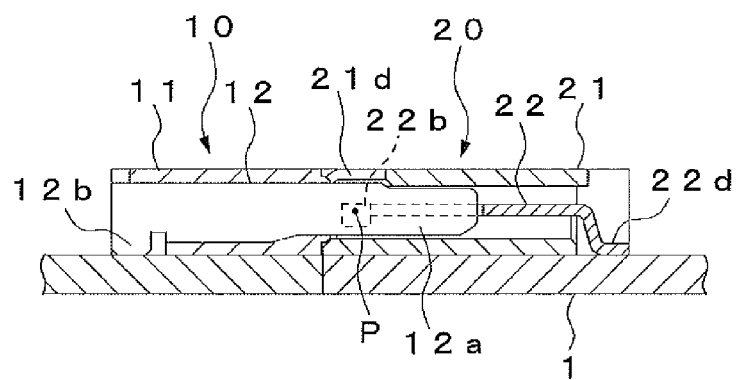
FIG. 20 is an A-A cross-sectional view showing the fitting step of the male connector and the female connector.
Figure 21:
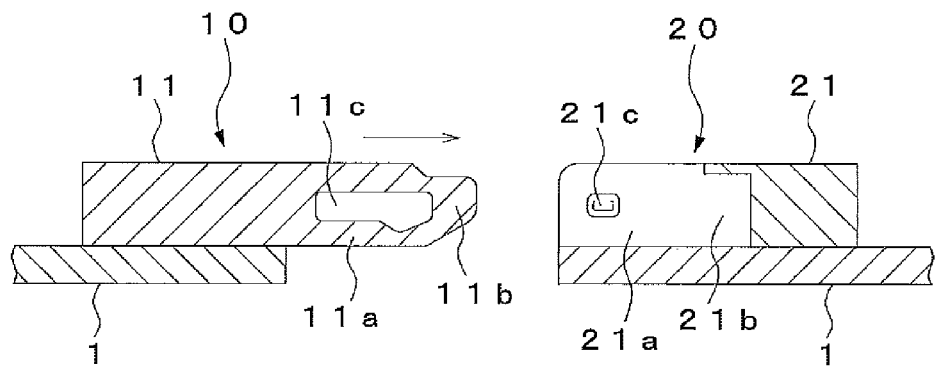
FIG. 21 is a B-B cross-sectional view showing the fitting step of the male connector and the female connector.
Figure 22:
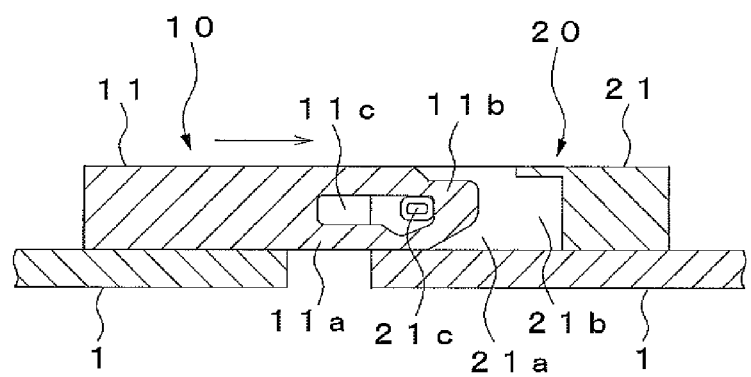
FIG. 22 is a B-B cross-sectional view showing the fitting step of the male connector and the female connector.
Figure 23:
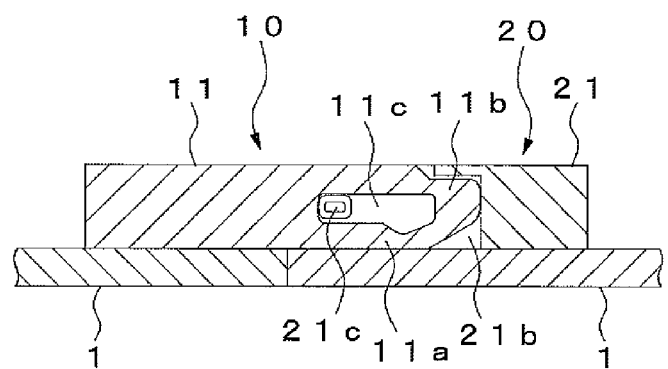
FIG. 23 is a B-B cross-sectional view showing the fitting step of the male connector and the female connector.
Figure 24:
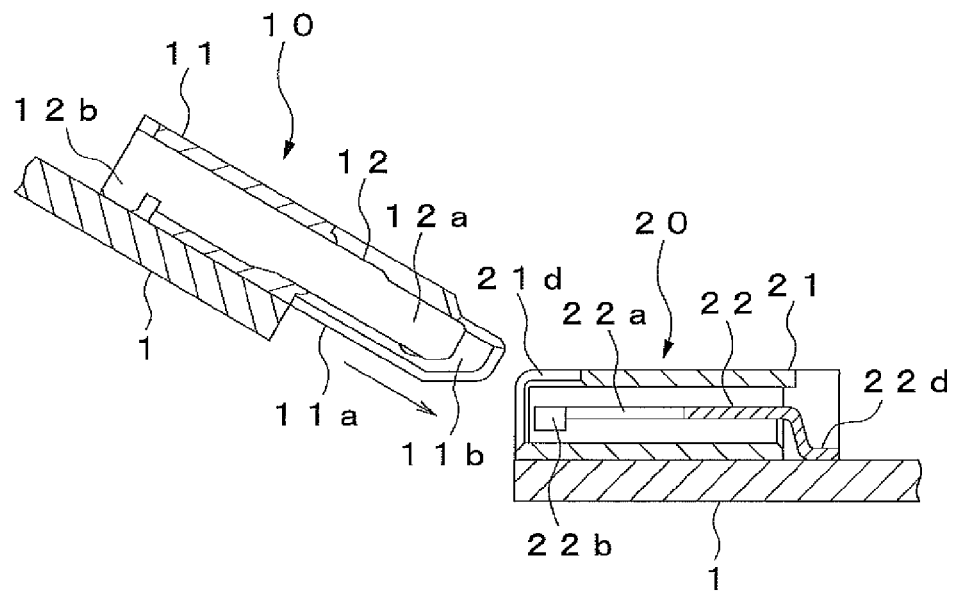
FIG. 24 is an A-A cross-sectional view showing a fitting step of the male connector and the female connector in a state where the connectors are inclined to each other.
Figure 25:
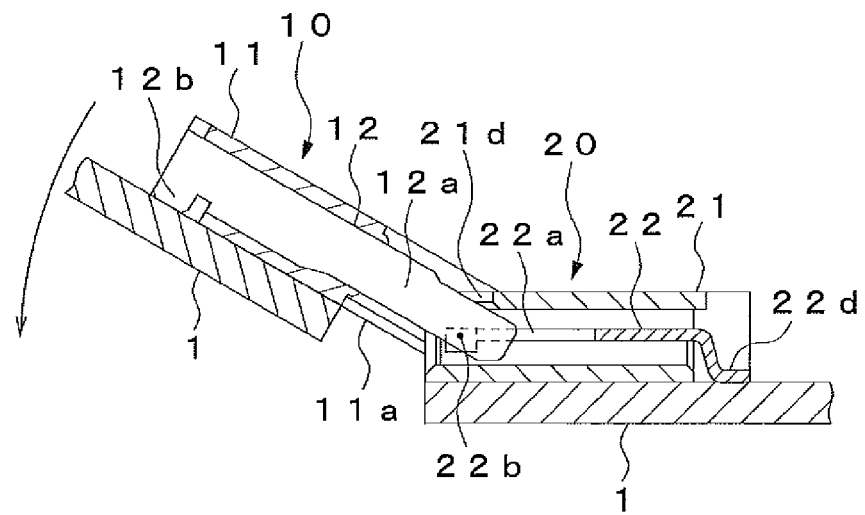
FIG. 25 is an A-A cross-sectional view showing a fitting step of the male connector and the female connector in the state where the connectors are inclined to each other.
Figure 26:
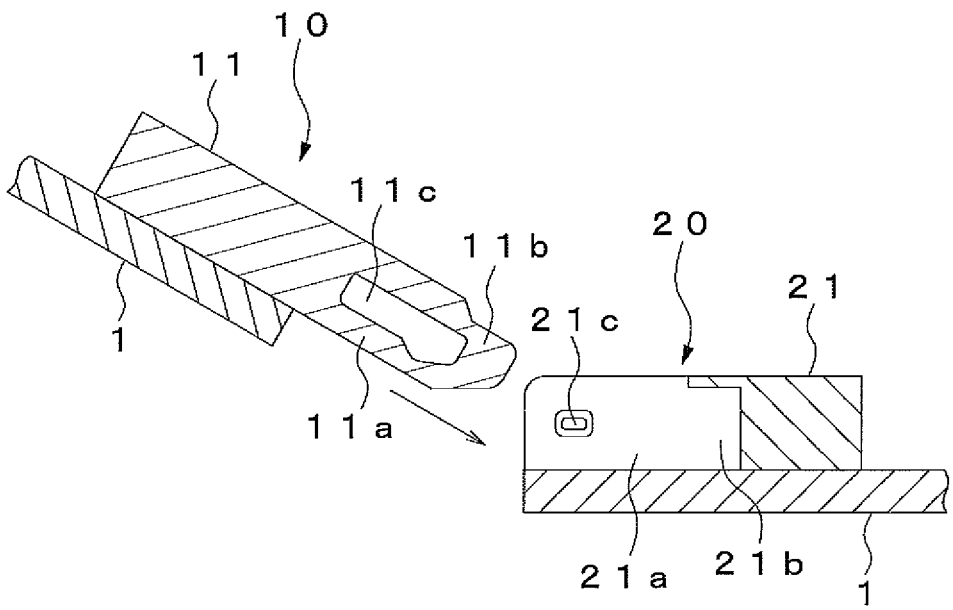
FIG. 26 is a B-B cross-sectional view showing the fitting step of the male connector and the female connector in the state where the connectors are inclined to each other.
Figure 27:
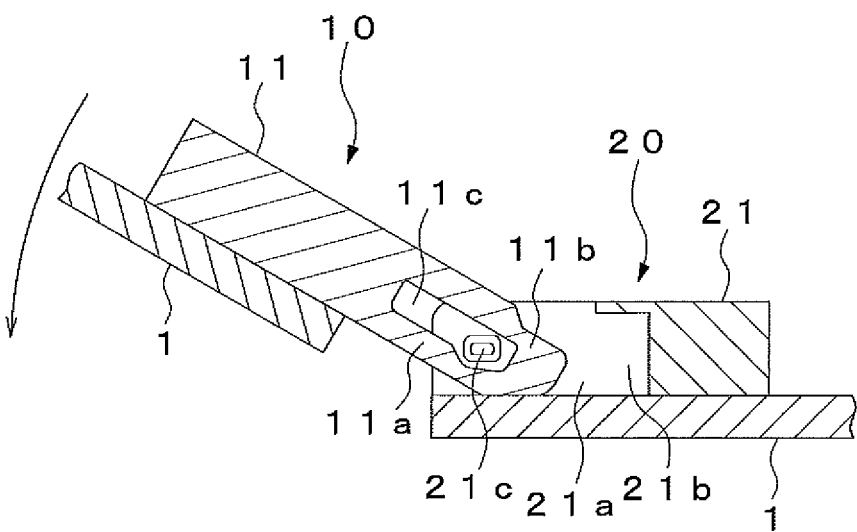
FIG. 27 is a B-B cross-sectional view showing the fitting step of the male connector and the female connector in the state where the connectors are inclined to each other.

In the state where the substrates 1 are connected to each other by the connectors 10 and 20 as described above, when the male connector 10 is moved in the direction away from the female connector 20, the projecting portion 21c is brought into contact with the other longitudinal end of the engagement hole 11c, so as to restrict the movement of the male connector 10. That is, as shown in FIG. 14 and FIG. 15, the male connector 10 and the female connector 20, which are connected to each other, are made movable relative to each other in the insertion/extraction direction by the distance L through which the projecting portion 21c can be moved in the engagement hole 11c in the longitudinal direction of the engagement hole 11c. Thereby, the male terminal 12 and the female terminal 22 are made slidable relative to each other by the distance L in a state of being in contact with each other.

Further, the male terminal 12 and the female terminal 22 are made rotatable relative to each other about the contact point P in a state of being in contact with each other, and hence the male terminal 12 and the female terminal 22 can be attached and detached to and from each other at an arbitrary rotating position. For example, in the case where the male connector 10 is fitted to the female connector 20 along an oblique direction as shown in FIG. 24 to FIG. 27, when each of the extension portions 11a of the male connector 10 is inserted into each of the recessed portions 21a of the female connector 20 from obliquely above, the inclined surface 11d of each of the extension portions 11a is, in a similar manner as described above, brought into contact with the projecting portion 21c of each of the recessed portions 21a, and also each of the extension portions 11a is made to get over the projecting portion 21c by the inclined surface 11d while being elastically deformed toward the width-direction outer side of the connector main body 11, so that the projecting portion 21c is engaged with the engagement hole 11c of each of the extension portions 11a. At this time, the contact portion 12a of each of the male terminals 12 is inserted into each of the insertion ports 21d of the female connector 20 along the oblique direction from the upper and front sides of the connector main body 21, so that the contact portion 12a of the male terminal 12 and the contact portion 22b of the female terminal 22 are brought into contact with each other. In this case, the male terminal 12 and the female terminal 22 are brought into contact with each other at the contact point P between the contact portions 12a and 22b. Therefore, when the male connector 10 is rotated downward about the contact point P, the male connector 10 and the female connector 20 are disposed horizontally relative to each other. Here, in the same manner as described above, when each of the extension portions 11a is moved toward the depth side of each of the recessed portions 21a as shown in FIG. 19, FIG. 20, FIG. 22 and FIG. 23, the male terminal 12 and the female terminal 22 are made to slide relative to each other while being in contact with each other at the contact point P, so that the male connector 10 and the female connector 20 are fitted to each other until the projecting portion 21c is brought into contact with one longitudinal end of the engagement hole 11c. At this time, the distal end portion 11b of each of the extension portions 11a is received by the lock hole 21b, so that the vertical movement of the distal end portion 11b is restricted by the lock hole 21b. Thereby, the male connector 10 and the female connector 20 are mutually locked in the horizontal state.

Figure 28:
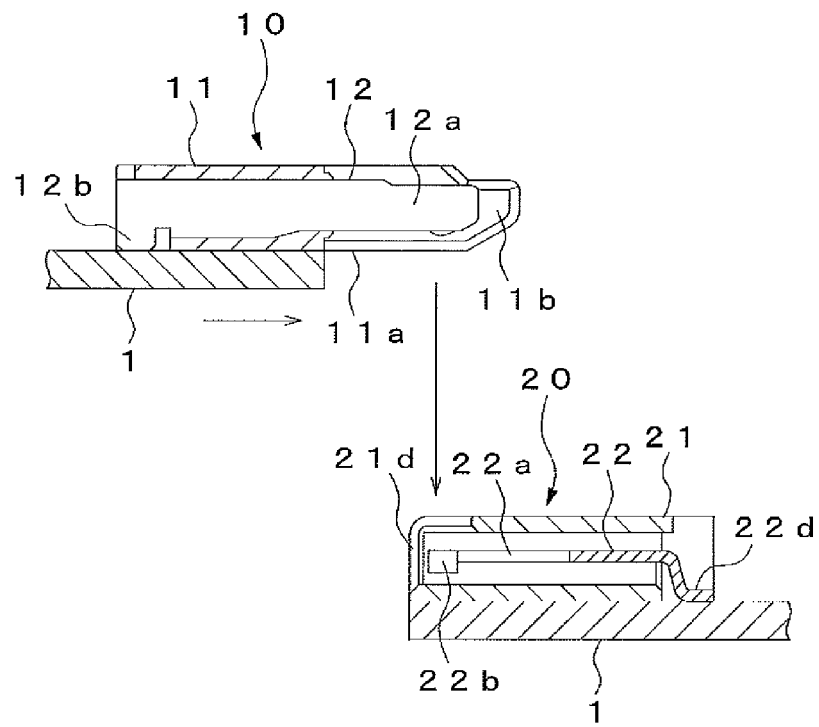
FIG. 28 is an A-A cross-sectional view showing a fitting step of the male connector and the female connector in a state where the connectors are perpendicular to each other.
Figure 29:
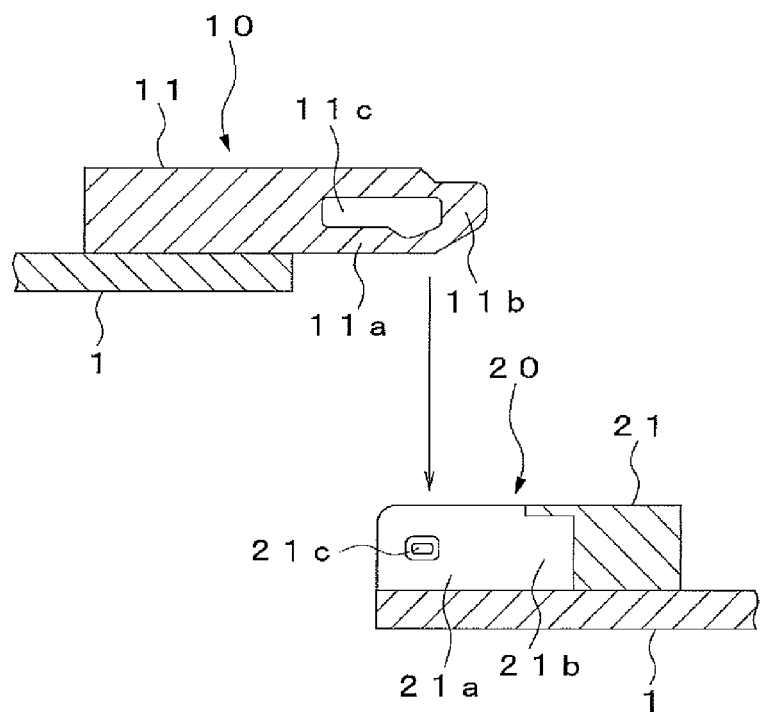
FIG. 29 is a B-B cross-sectional view showing the fitting step of the male connector and the female connector in the state where the connectors are perpendicular to each other.

Further, the male connector 10 can also be fitted to the female connector 20 along a perpendicular direction. That is, when each of the extension portions 11a of the male connector 10 is inserted into each of the recessed portions 21a of the female connector 20 along a perpendicular direction from above as shown in FIG. 28 and FIG. 29, the inclined surface 11d of each of the extension portions 11a is brought into contact with the projecting portion 21c of each of the recessed portions 21a in the same manner as described above, and also each of the extension portions 11a is made to get over the projecting portion 21c by the inclined surface 11d while being elastically deformed toward the width-direction outer side of the connector main body 11, so that the projecting portion 21c is engaged with the engagement hole 11c of each of the extension portions 11a. At this time, the contact portion 12a of each of the male terminals 12 is inserted into each of the insertion ports 21d of the female connector 20 from the upper side of the connector main body 21, so that the contact portion 12a of the male terminal 12 and the contact portion 22b of the female terminal 22 are brought into contact with each other. Here, in the same manner as described above, when each of the extension portions 11a is moved toward the depth side of each of the recessed portions 21a as shown in FIG. 19, FIG. 20, FIG. 22 and FIG. 23, the male terminal 12 and the female terminal 22 are made to slide relative to each other while being in contact with each other at the contact point P, so that the male connector 10 and the female connector 20 are fitted to each other until the projecting portion 21c is brought into contact with one longitudinal end of the engagement hole 11c. At this time, in the same manner as described above, the distal end portion 11b of each of the extension portions 11a is received by the lock hole 21b, so that the male connector 10 and the female connector 20 are mutually locked in the horizontal state.

In the case where the connection between the male connector 10 and the female connector 20 is released, when the male connector 10 is moved in the horizontal direction away from the female connector 20, the projecting portion 21c is brought into contact with one longitudinal end of the engagement hole 11c. However, when a force is further applied in the same direction, each of the extension portions 11a is elastically deformed toward the width-direction outer side of the connector main body 11, so that the edge portion of the engagement hole 11c is made to get over the projecting portion 21c. Thereby, the male terminal 12 is extracted from the female terminal 22, so that the male connector 10 and the female connector 20 are separated from each other.

In this way, in the connector of the present embodiment, the male terminal 12 of the male connector 10 and the female terminal of the female connector 20 are made slidable relative to each other in a state of being in contact with each other, and hence thermal expansion and contraction of each of the substrates 1, or positional deviation of each of the substrates 1 can be absorbed by the sliding of the male terminal 12 and the female terminal 22 relative to each other. Thereby, deformation of the substrates 1 and breakage of the connectors 10 and 20 due to the thermal expansion of the substrates 1 can be prevented, and also connection failure due to the thermal contraction or the positional deviation of the substrates 1 can be prevented.

Further, the male terminal 12 and the female terminal 22 are configured to be rotatable relative to each other about the contact point P in a state of being in contact with each other, and hence the male terminal 12 and the female terminal 22 can be attached and detached to and from each other at an arbitrary rotating position. Thereby, for example, in such a case where the one substrate 1, which is fixed to a mounting surface, is connected to the other substrate 1, the connectors 10 and 20 can be connected to each other in a state where the other substrate 1 is inclined to the one substrate 1, and hence the work of connecting the substrates 1 to each other can be easily performed. Further, the male connector 10 and the female connector 20 can be inclined to each other in a state of being in contact with each other. Therefore, even when the mounting surface of the substrate 1 is inclined, the connectors 10 and 20 are fitted to each other along an oblique direction corresponding to the inclination of the mounting surface. Thereby, the substrates 1 can also be connected to each other on the inclined mounting surface.

Further, the male terminal 12 formed in a plate shape is sandwiched in the female terminal 22 formed in the two-forked shape, and thereby the male terminal 12 and the female terminal 22 are made slidable and rotatable relative to each other in a state of being in contact with each other. Therefore, even when the male terminal 12 and the female terminal 22 are made to slide and rotate relative to each other, the male terminal 12 is sandwiched in the female terminal 22, and thereby the conductive state between the male terminal 12 and the female terminal 22 can be surely obtained, so that the reliability of the connection can be improved.

In this case, the mutually facing edge portions of the respective contact portions 22b of the female terminal 22 are each formed by the chamfered portion 22c having the curved surface shape. Therefore, even when the male connector 10 and the female connector 20 are fitted to each other along an oblique direction or a perpendicular direction, the contact portion 12a of the male terminal 12 can be smoothly guided into a portion between the respective contact portions 22b of the female terminal 22 by the respective chamfered portions 22c, so that the male terminal 12 and the female terminal 22 can be easily connected to each other at the time when the terminals 12 and 22 are fitted to each other.

Further, in the connector main body 21 of the female connector 20, the insertion port 21d, into which the female terminal 22 is inserted, is formed so as to extend from the front surface to the upper surface of the connector main body 21. Therefore, when the male connector 10 is fitted to the female connector 20 along an oblique direction or a perpendicular direction, the male terminal 12 and the female terminal 22 can be easily fitted to each other.

Further, in the connector main body 11 of the male connector 10, and in the connector main body 21 of the female connector 20, the engagement hole 11c and the projecting portion 21c, which serve as an engaging portion to permit the male terminal 12 and the female terminal 22 to engage with each other in a mutually slidable and rotatable manner, are respectively provided, so that the distance, through which the male terminal 12 and the female terminal 22 are made to slide relative to each other in a state of being in contact with each other, is restricted to the predetermined distance L by the engagement hole 11c and the projecting portion 21c. Thereby, even when the male terminal 12 and the female terminal 22 are made to slide relative to each other, the contact state between the male terminal 12 and the female terminal 22 cannot be easily released, and hence such configuration is very effective to prevent a connection failure.

Further, the engagement hole 11c is provided in each of the extension portions 11a of the male connector 10, and also the projecting portion 21c is provided at each of the recessed portions 21a of the female connector 20 so that, when each of the extension portions 11a is received by each of the recessed portions 21a, the projecting portion 21c is engaged with the engagement hole 11c. Therefore, the engagement hole 11c and the projecting portion 21c can be easily engaged with each other by inserting each of the extension portions 11a into each of the recessed portions 21a, and also the connector main bodies 11 and 21 can be surely fitted to each other by each of the extension portions 11a and each of the recessed portions 21a. Thereby, it is possible to obtain sufficient fitting strength in the connected state of the connector main bodies 11 and 21.

In this case, when each of the extension portions 11a is inserted into the depth side of each of the recessed portions 21a, the distal end portion 11b of each of the extension portions 11a is received by the lock hole 21b of each of the recessed portions 21a. Thereby, the vertical movement of the distal end portion 11b is restricted by the lock hole 21b serving as a rotation restricting portion, so that the rotation of the male terminal 12 and the female terminal 22 relative to each other is restricted in the state where the male connector 10 and the female connector 20 are fitted to each other. Therefore, the male connector 10 and the female connector 20 can be locked to each other in a horizontal state, and hence such configuration is very advantageous, for example, in such a case where the substrates 1 before attachment are to be respectively held in a horizontal state.

Figure 30:
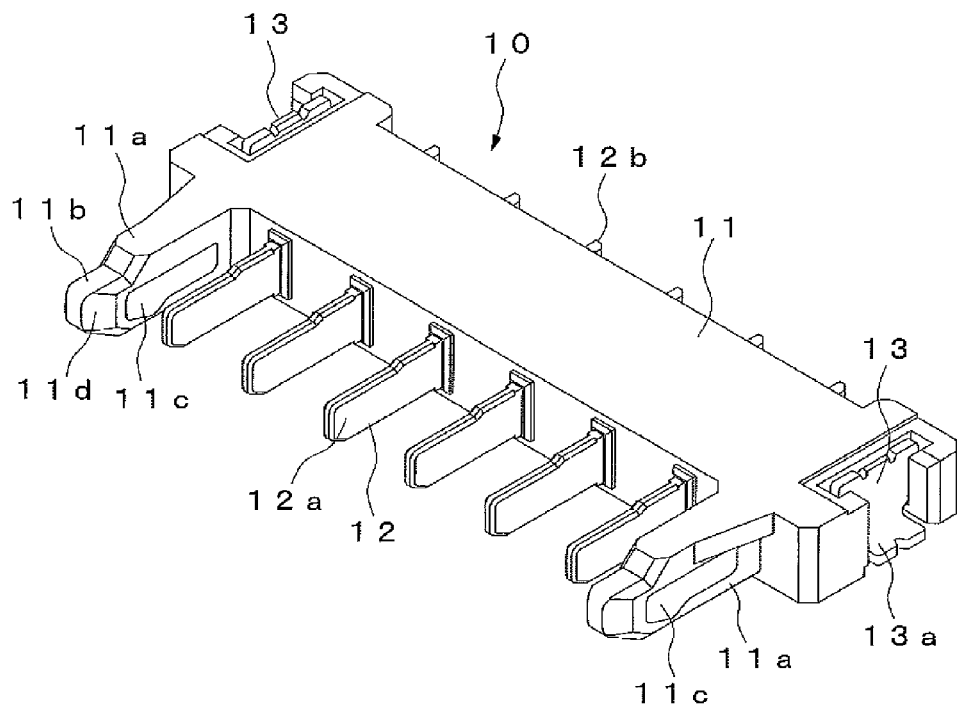
FIG. 30 is a perspective view of a male connector showing another embodiment of the present invention.
Figure 31:
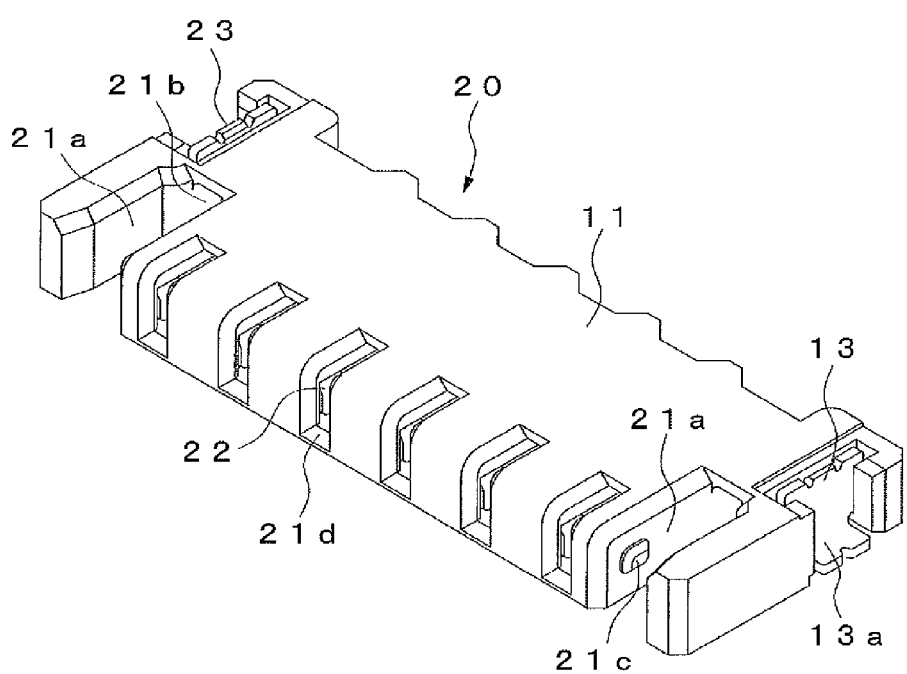
FIG. 31 is a perspective view of a female connector.

Note that the above-described embodiment is shown to include a pair of the male terminals 12 of the male connector 10 and a pair of the female terminals 22 of the female connector 20, but the number of the male terminals 12 and of the female terminals 22 is not limited to two. For example, the number of the male terminals 12 and of the female terminals 22 may be set to six as in a connector shown as another embodiment in FIG. 30 and FIG. 31, or the number of the male terminals 12 and of the female terminals 22 may be set to one.

Further, a connector used for an LED substrate is shown as the above-described embodiment, but the present invention can also be applied to a connector used for a substrate other than the LED substrate.

REFERENCE SIGNS LIST

1 . . . Substrate, 2 . . . LED, 10 . . . Male connector, 11 . . . Connector main body, 11a . . . Extension portion, 11c . . . Engagement hole, 12 . . . Male terminal, 12a . . . Contact portion, 20 . . . Female connector, 21 . . . Connector main body, 21a . . . Recessed portion, 21b . . . Lock hole, 21c . . . Projecting portion, 22 . . . Female terminal, 22a . . . Elastic piece portion, 22b . . . Contact portion, 22c . . . Chamfered portion

The invention claimed is:

1. A connector, comprising:
a male connector attached to an end portion of one substrate and having a connector main body,
a female connector attached to an end portion of another substrate and having a connector main body,
a male terminal held at the connector main body of the male connector, and
a female terminal held at the connector main body of the female connector, wherein the male connector and the female connector are configured to be fitted to each other to thereby connect the substrates to each other, the male terminal and the female terminal are configured to be slidable relative to each other in a state of being in contact with each other, and are configured to be rotatable relative to each other about a contact point in a state of being in contact with each other, the male connector has a male lock member, and the female connector has a female lock member, and the male lock member and the female lock member are configured to engage with each other to restrict the rotation of the male terminal and the female terminal relative to each other when the male terminal and the female terminal are fitted to each other to a predetermined position.

2. The connector according to claim 1, wherein the male terminal is in a plate shape, and the female terminal is in a two-forked shape, and when the male terminal is sandwiched in the female terminal, the male terminal and the female terminal are brought into contact with each other so as to be slidable and rotatable relative to each other.

3. The connector according to claim 2, wherein the female terminal includes
- a pair of two fork-shaped elastic piece portions provided in the width direction of the connector, and
- a pair of mutually facing contact portions respectively provided at distal end portions of the elastic piece portions, and each of mutually facing edge portions of the contact portions is formed by a chamfered portion having a curved surface shape.

4. The connector according to claim 1, wherein the connector main body of the female connector includes an insertion port into which the male terminal is configured to be inserted, and the insertion port is in a portion ranging from a front surface to an upper surface of the connector main body of the female connector.

5. The connector according to claim 1, wherein the male connector and the female connector respectively include engaging portions which are detachably engagable with each other, and each of the engaging portions is configured such that, in a state where the male terminal and the female terminal are in contact with each other, the male terminal and the female terminal are permitted to slide and rotate relative to each other, and is configured such that a distance through which the male terminal and the female terminal are permitted to slide relative to each other is restricted within a predetermined distance.

6. The connector according to claim 5, wherein the connector main body of the male connector includes an extension portion extending to the side of the female connector, the connector main body of the female connector includes a recessed portion for receiving therein the extension portion of the male connector, and the engaging portions are respectively provided in the extension portion and the recessed portion.

7. The connector according to claim 2, wherein the connector main body of the female connector includes an insertion port into which the male terminal is configured to be inserted, and the insertion port is in a portion ranging from a front surface to an upper surface of the connector main body of the female connector.

8. The connector according to claim 3, wherein the connector main body of the female connector includes an insertion port into which the male terminal is configured to be inserted, and the insertion port is in a portion ranging from a front surface to an upper surface of the connector main body of the female connector.

9. The connector according to claim 1, wherein the male lock member is a distal end of an extension portion of the male connector, and the female lock member is a lock hole to receive the distal end such that the male lock member and the female lock member are engaged with each other.

* * * * *